US 6,711,015 B2

(12) United States Patent
Syring et al.

(10) Patent No.: US 6,711,015 B2
(45) Date of Patent: Mar. 23, 2004

(54) DEVICE FOR COOLING CPU CHIP

(75) Inventors: Harold Syring, Temple, TX (US); Rex Karl, Temple, TX (US)

(73) Assignees: Acer Inc., Taipei (TW); Wistron Corp., Taipei (TW)

( * ) Notice: Subject to any disclaimer, the term of this patent is extended or adjusted under 35 U.S.C. 154(b) by 0 days.

(21) Appl. No.: 10/067,698

(22) Filed: Feb. 4, 2002

(65) Prior Publication Data

US 2003/0147213 A1 Aug. 7, 2003

(51) Int. Cl.[7] .................................................. H05K 7/20
(52) U.S. Cl. ..................... 361/695; 165/80.3; 415/213.1; 454/184
(58) Field of Search ................................ 248/505, 510, 248/680, 694; 361/687, 690, 695, 697, 703, 717–719; 312/236; 454/184; 415/178, 213.1, 214.1; 416/223 R; 165/80, 3, 121–126

(56) References Cited

U.S. PATENT DOCUMENTS

| | | | | |
|---|---|---|---|---|
| 5,495,389 A | * | 2/1996 | Dewitt et al. | |
| 5,707,282 A | * | 1/1998 | Clements et al. | 454/184 |
| 6,164,369 A | * | 12/2000 | Stoller | 165/104.33 |
| 6,269,001 B1 | * | 7/2001 | Matteson et al. | 361/695 |
| 6,478,284 B2 | * | 11/2002 | Qiu | 248/680 |

* cited by examiner

Primary Examiner—Gerald Tolin
(74) Attorney, Agent, or Firm—Ladas & Parry

(57) ABSTRACT

A CPU chip-cooling device is provided. The CPU chip is disposed on a chassis, and the cooling device comprises a heat sink, a bracket and a fan. The heat sink is disposed on the CPU chip. The bracket, having a pivot portion and a retention portion, is pivotally disposed on the chassis by the pivot portion. The fan is disposed on the bracket. The fan is adjacent to the heat sink when the bracket engages with the chassis by the retention portion. The fan is away from the heat sink when the retention portion of the bracket does not engage with the chassis.

8 Claims, 3 Drawing Sheets

DEVICE FOR COOLING CPU CHIP

BACKGROUND OF THE INVENTION

1. Field of the Invention

The invention relates to a device for cooling a CPU chip; in particular, the invention relates to a CPU cooling device attached without the use of fasteners.

2. Description of the Related Art

With developments in the computer and the electronic technologies, efficiency of the central processing unit (CPU) has been improved dramatically. The CPU chip generates heat during operation that must be dissipated to avoid damage to the CPU chip. Therefore, it is necessary to aid the dissipation of internally generated heat by the use of a cooling device.

A wide variety of cooling device designs has been employed for dissipation of internally generated heat from the CPU chip. For example, a conventional CPU cooling device is shown in FIG. 1. The cooling device comprises a heat sink 1, a bracket 2 and a cooling fan 25. The heat sink 1 is disposed on the CPU chip 30.

The heat sink 1 includes a plurality of rows and/or columns of fins 11 extending upwardly from an upper side of the based plate of the heat sink 1, wherein two separate grooves 13 are defined between each adjacent fin block 15. The bracket 2 includes a hole 21 defined in an appropriate portion thereof, and a support member 23 provided in the hole 21 and connected to the periphery defining the hole 21 by a plurality of ribs 22 extending to the support member 23. A stud 24 is formed on an upper side of the support member 23 and includes a second hole (not labeled) defined therein for rotationally receiving a rotor shaft of the fan 25.

After the bracket 2, receiving the fan 25, is mounted on the heat sink 1, the whole cooling device is fixed on the CPU chip 30 by the use of screws 40. The screws 40, passing through through-holes (not shown) of the heat sink 1, screw into screw hole 31 of the CPU chip 30.

There are other mounting aspects to the cooling device. For example, the bracket is fixed at the chassis of the computer by the screws. However, the fan assembly, comprising the fan and the bracket, is typically mounted with fasteners, such as screws. This method of attachment is more costly and time consuming.

SUMMARY OF THE INVENTION

In order to address the disadvantages of the aforementioned cooling device, the invention provides a cooling device attached without the use of fasteners.

Accordingly, the invention provides a CPU chip-cooling device. The CPU chip is disposed on a chassis, and the cooling device comprises a heat sink, a bracket and a fan. The heat sink is disposed on the CPU chip. The bracket, having at least one pivot portion and at least one retention portion, is pivotally disposed on the chassis by the pivot portion. The fan is disposed on the bracket. The fan is adjacent to the heat sink when the bracket engages with the chassis by the retention portion. The fan is away from the heat sink when the retention portion of the bracket does not engage with the chassis.

Furthermore, the chassis is provided with at least one pivot recess and at least one retention recess, and the pivot portion is provided with at least one pivot post corresponding to the pivot recess, and the retention portion is provided with at least one retention post corresponding to the retention recess.

Furthermore, the bracket is provided with a first engaging portion, and the fan is provided with a second engaging portion corresponding to the first engaging portion. The first engaging portion comprises at least one raised pad and at least one locator post. The raised pad is integrally formed on the bracket, and the locator post is integrally formed on the raised pad. The second engaging portion comprises at least one locator recess corresponding to the locator post.

Furthermore, the bracket is provided with at least one retaining hook for retaining the fan in position.

Furthermore, the invention provides a fan assembly comprising a bracket and a fan. The bracket is provided with at least one first engaging portion and at least one retaining hook. The fan, having a second engaging portion corresponding to the first engaging portion, is disposed on the bracket by the retaining hook and the engagement of the first engaging portion and the second engaging portion.

BRIEF DESCRIPTION OF THE DRAWINGS

The invention is hereinafter described in detail with reference to the accompanying drawings in which.

DETAILED DESCRIPTION OF THE INVENTION

Figure 3A:
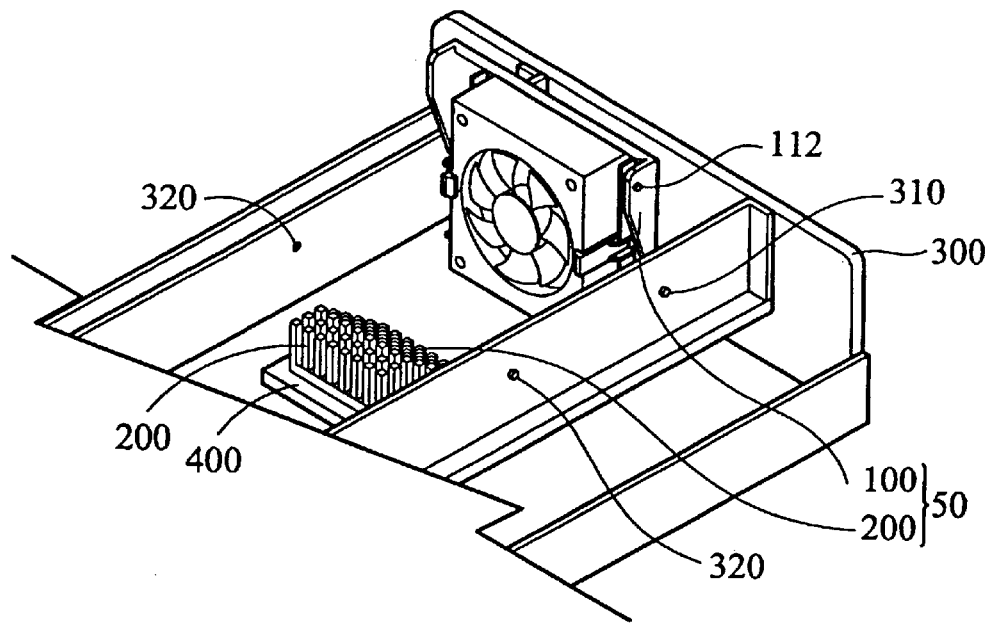
FIG. 3a is a perspective view depicting a cooling device of this invention, wherein the fan assembly is away from a heat sink.

Referring to FIG. 3a, a CPU chip-cooling device 50 of this invention comprises a fan assembly 100 and a heat sink 200.

Figure 1:
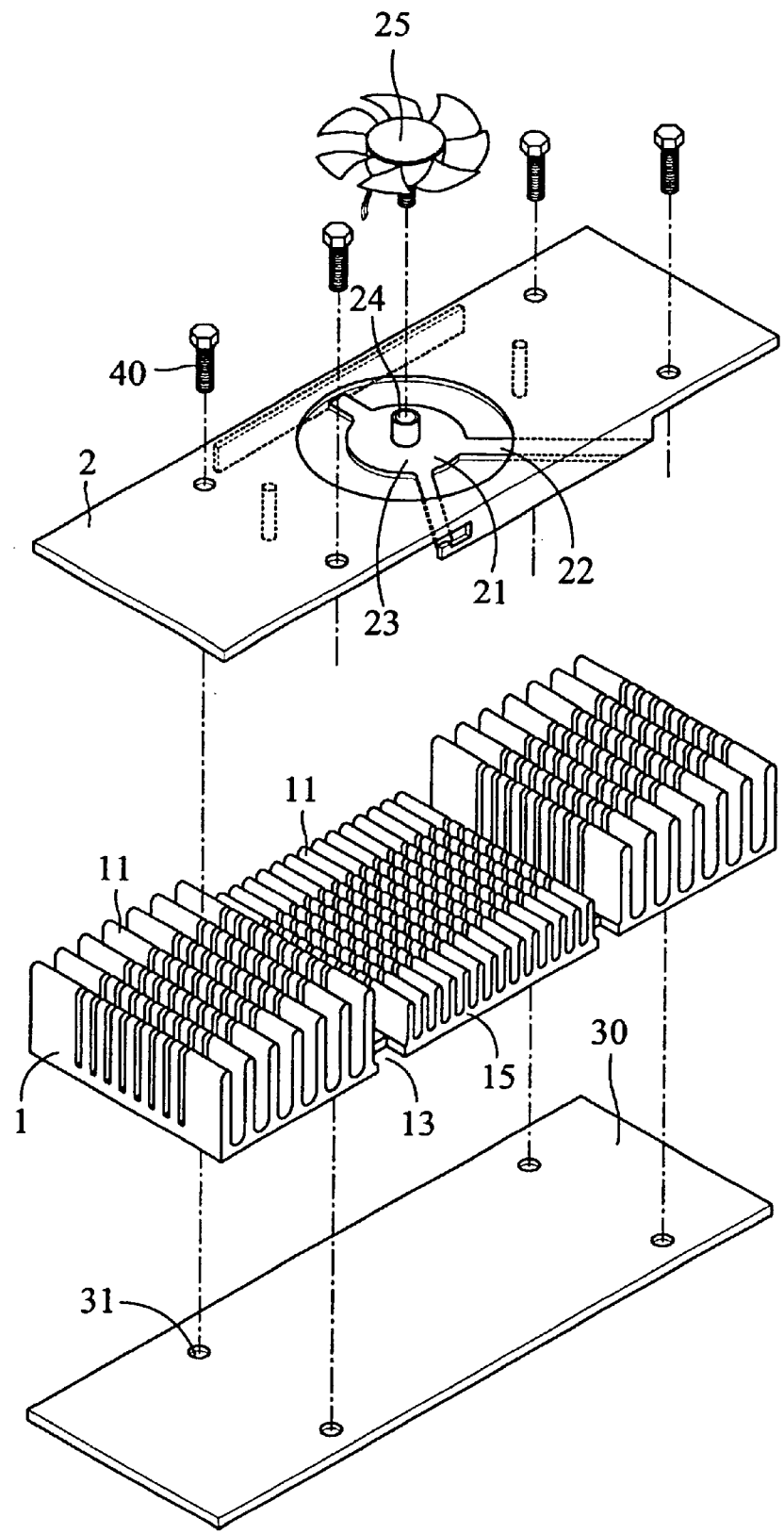
FIG. 1 is an exploded view depicting a conventional cooling device.
Figure 2A:
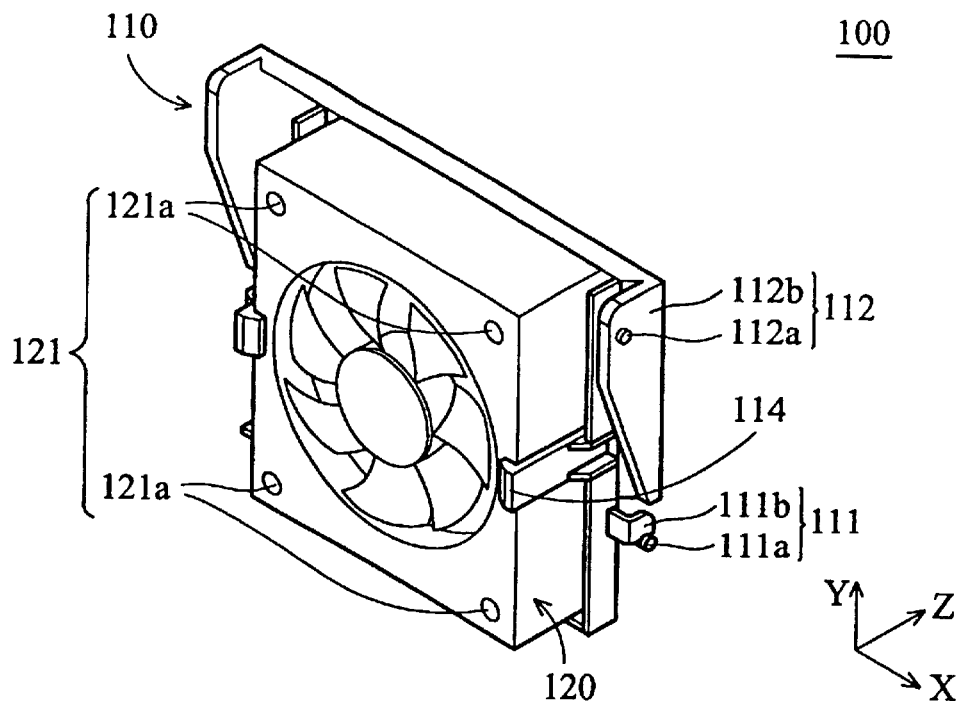
FIG. 2a is a perspective view depicting a fan assembly of this invention.
Figure 2B:
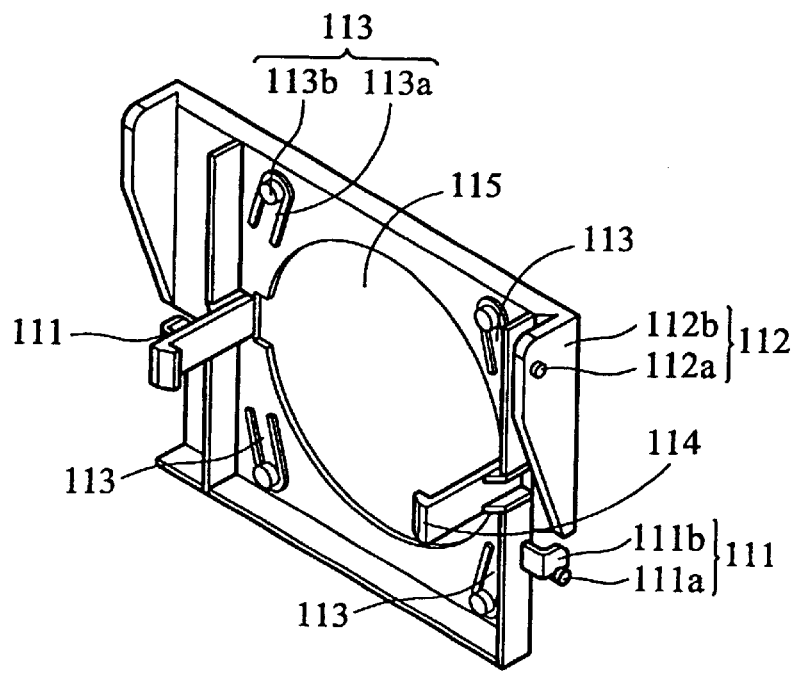
FIG. 2b is a perspective view depicting a bracket of this invention.

As shown in FIG. 2a and FIG. 2b, the fan assembly 100 comprises a bracket 110 and a fan 120. The bracket 110 is provided with two pivot portions 111, two retention portions 112, four first engaging portions 113 and two retaining hooks 114. Each of the pivot portions 111 is located at one end of the bracket 110 and provided with two pivot posts 111a and two connecting parts 111b. The connecting parts 111b connect the pivot posts 111a with a body of the bracket 110. Each of the retention portions 112 is located at the other end of the bracket 110 and provided with two retention posts 112a and two connecting parts 112b. The connecting parts 112b connect the retention posts 112a with a body of the bracket 110. The first engaging portion 113 comprises four raised pads 113a and four locator posts 113b. The raised pads 113a are integrally formed on the bracket 110, and are flexible to allow for variations in the thickness of the fan 120 in a Z direction. The locator posts 113b are integrally formed on the ends of the raised pads 113a to locate the fan 120 in X and Y position. The retaining hooks 114, extending in the Z direction, retain the fan 120 in position. A through hole 115 is formed at the center portion of the bracket 110 for the fan 120 passing through.

The fan 120, having a second engaging portion 121 corresponding to the first engaging portion 113, is disposed on the bracket 110 by the retaining hooks 114 and the engagement of the first engaging portion 113 and the second engaging portion 121. The second engaging portion 121 comprises four locator recesses 121a corresponding to the locator posts 113b respectively. By means of the first engaging portion 113 and the second engaging portion 121, the bracket 110 is designed for the fan 120 to snap into position, and thus no further fasteners are required. Also, the design of the first engaging portion 113 allows for tolerance variations while maintaining a tight snap fit assembly.

Figure 3B:
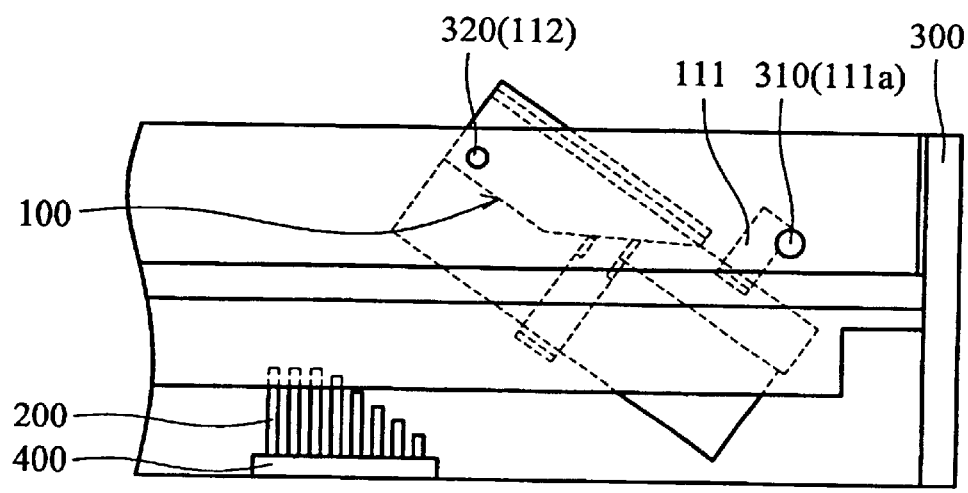
FIG. 3b is a perspective view depicting a cooling device of this invention, wherein the fan assembly is adjacent to the heat sink.

Referring to FIG. 3a and FIG. 3b, the cooling device 50 is used for cooling a CPU chip 400. The CPU chip 400 is disposed on a chassis 300. The heat sink 200 is disposed on the CPU chip 400.

The chassis 300 is provided with two pivot recesses 310, corresponding to the pivot posts 111a separately, and two retention recesses 320 corresponding to the retention posts 112a separately. Thus, the bracket 110 is pivotally disposed on the chassis 300 by the engagement of the pivot posts 111a and the pivot recesses 320, as shown in FIG. 3a. That is, the bracket 110 may snap into place over the area of the heat sink 200 and the CPU chip 400. Furthermore, the pivot posts 111a and pivot recesses 310 allow the fan assembly 100 to pivot away from the area of the heat sink 200 and the CPU chip 400, thus allowing easy access to this area when required. Also, pivoting the fan assembly 100 out of the way allows access to this area without having to unplug and disassemble the fan assembly 100 from the whole unit.

The fan 120, mounted on the bracket 110, is adjacent to the heat sink 200 when the retention posts 112a of the bracket 110 engage with the retention recesses 320 of the chassis 300, as shown in FIG. 3b. That is, by means of retention posts 112a, the bracket 110 may snap into retention recesses 320 on the chassis 300 to maintain its normal position. By contrast, when the retention posts 112a of the bracket 110 do not engage with the retention recesses 320 of the chassis 300, the fan 120 is away from the heat sink 400. The design of the pivot posts 111a and the retention posts 112a allows easy pivot actuation and positive location retention.

According to this invention, implementation of such a design is simple and requires no extra time or manpower. This design poses no disadvantages or problems to incorporate.

It is understood that the amount of the engaging portions, the pivot portions and the retention portions is not limited.

While the invention has been particularly shown and described with reference to a preferred embodiment, it will be readily appreciated by those of ordinary skill in the art that various changes and modifications may be made without departing from the spirit and scope of the invention. It is intended that the claims be interpreted to cover the disclosed embodiment, those alternatives which have been discussed above, and all equivalents thereto.

What is claimed is:

1. A device cooling a CPU chip disposed on a chassis comprising:
    a heat sink disposed on the CPU chip;
    a bracket, having at least one pivot portion and at least one retention portion, rotatably mounted on the chassis by the pivot portion in one of two positions; and
    a fan disposed on the bracket, wherein the fan is relatively closer to the heat sink when the bracket engages with the chassis by the retention portion in a first chassis position, and wherein the fan is relatively farther away from the heat sink when the retention portion of the bracket does not engage the chassis in a second chassis position and the pivot portion still engages the chassis.

2. The device as claimed in claim 1, wherein the chassis is provided with at least one pivot recess and at least one retention recess, and the pivot recess is provided with at least one pivot port corresponding to the pivot recess, and the retention portion is provided with at least one retention post corresponding to the retention recess.

3. The device as claimed in claim 1, wherein the bracket is provided with at least one engaging portion, and the fan is provided with at least one second engaging portion corresponding to the first engaging portion.

4. The device as claimed in claim 3, wherein the first engaging portion comprises:
    at least one raised pad integrally formed on the bracket; and
    at least one locator post integrally formed on the raised pad.

5. The device as claimed in claim 4, wherein the second engaging portion comprises at least one locator recess corresponding to the locator post.

6. The device as claimed in claim 1, wherein the bracket is provided with at least one retaining hook for retaining the fan in position.

7. A fan assembly comprising:
    a bracket having at least one first engaging portion and at least one retaining hook; and
    a fan, having a second engaging portion corresponding to the first engaging portion, disposed on the bracket by the retaining hook and the engagement of the first engaging portion and the second engaging portion;
    wherein the first enaging portion comprises:
        at least one raised pad integrally formed on the bracket; and
        at least one locator post integrally formed on the raised pad.

8. The fan assembly as claimed in claim 7, wherein the second engaging portion comprises at least one locator recess corresponding to the locator post.

* * * * *